United States Patent
Jang et al.

(10) Patent No.: US 9,541,789 B2
(45) Date of Patent: Jan. 10, 2017

(54) METHOD OF FABRICATING POLARIZING MEMBER, AND METHOD OF FABRICATING LIQUID CRYSTAL DISPLAY INCLUDING POLARIZING MEMBER

(71) Applicant: Samsung Display Co., Ltd., Yongin-si (KR)

(72) Inventors: Dae-Hwan Jang, Yongin-si (KR);
Kang-Soo Han, Yongin-si (KR);
Jung-Gun Nam, Yongin-si (KR);
Dae-Young Lee, Yongin-si (KR);
Gug-Rae Jo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/881,937

(22) Filed: Oct. 13, 2015

(65) Prior Publication Data
US 2016/0116799 A1    Apr. 28, 2016

(30) Foreign Application Priority Data
Oct. 28, 2014   (KR) .................. 10-2014-0147694

(51) Int. Cl.
| | | |
|---|---|---|
| H01L 21/00 | (2006.01) | |
| G02F 1/1335 | (2006.01) | |
| H01L 27/12 | (2006.01) | |
| G02B 5/30 | (2006.01) | |
| G03F 7/16 | (2006.01) | |

(52) U.S. Cl.
CPC ....... *G02F 1/133528* (2013.01); *G02B 5/3058* (2013.01); *G03F 7/16* (2013.01); *H01L 27/1288* (2013.01); *G02F 2001/133548* (2013.01)

(58) Field of Classification Search
CPC .................................................. G02F 1/133528
USPC ............................................................ 438/23
See application file for complete search history.

(56) References Cited

U.S. PATENT DOCUMENTS

| 7,738,056 | B2 | 6/2010 | Tsujimura et al. |
| 8,525,958 | B2 | 9/2013 | Lee |
| 2014/0055715 | A1 | 2/2014 | Lee et al. |

FOREIGN PATENT DOCUMENTS

| KR | 10-2005-0038243 | 4/2005 |
| KR | 10-2011-0101893 | 9/2011 |
| KR | 10-2014-0030382 | 3/2014 |

*Primary Examiner* — Anthony Ho
(74) *Attorney, Agent, or Firm* — H.C. Park & Associates, PLC

(57) ABSTRACT

A method of fabricating a polarizing member includes: sequentially disposing a metal layer and a preliminary pattern layer on a base substrate including a display area and a non-display area; forming a patterned resin layer on the preliminary pattern layer in the display area, the patterned resin layer including patterns formed on a surface of the patterned resin layer; surface-treating the preliminary pattern layer and the patterned resin layer; forming a mask pattern including a photoresist material on the preliminary pattern layer disposed in the non-display area; forming preliminary patterns on the preliminary pattern layer using the patterned resin layer; and forming a wire grid polarizing unit in the display area by etching the metal layer using the preliminary pattern and the mask pattern as a polarizing pattern.

20 Claims, 10 Drawing Sheets

METHOD OF FABRICATING POLARIZING MEMBER, AND METHOD OF FABRICATING LIQUID CRYSTAL DISPLAY INCLUDING POLARIZING MEMBER

CROSS REFERENCE TO RELATED APPLICATION

This application claims priority from and the benefit of Korean Patent Application No. 10-2014-0147694, filed on Oct. 28, 2014, which is hereby incorporated by reference for all purposes as if fully set forth herein.

BACKGROUND

Field

Exemplary embodiments relate to a method of fabricating a polarizing member, and a method of fabricating a liquid crystal display including the polarizing member.

Discussion of the Background

A liquid crystal display device includes a liquid crystal display panel disposed is between two polarizing plates. The liquid crystal display device applies an electric signal to each pixel of the liquid crystal display panel to change an arrangement of liquid crystal molecules and control the amount of light passing through.

The liquid crystal display device is a light receiving device, and requires a backlight unit. The backlight unit includes a light source, a light guide plate for improving efficiency of light moving to the liquid crystal display panel and a plurality of optical sheets. A large portion of light emitted from the light source is lost while passing through the light guiding plate and the optical sheets.

The polarizing plates are an absorptive polarizing plate configured to selectively absorb and transmit light, and may absorb about 50% of light transmitted to the liquid crystal display panel. Accordingly, a user may view the very small portion of the light emitted from the light source, for example, about 10% or lower of light.

A polarizing member including a wire grid may have improved light transmittance. However, such polarizing member with a wire grid may have increased fabrication costs due to forming the wire grid through a photolithography process.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a method of fabricating a polarizing member including a wire grid with decreased processing cost.

Exemplary embodiments provide a method of fabricating a liquid crystal display device including the polarizing member.

Additional aspects will be set forth in the detailed description which follows, and, in part, will be apparent from the disclosure, or may be learned by practice of the inventive concept.

According to one or more exemplary embodiments, a method of fabricating a polarizing member includes: sequentially disposing a metal layer and a preliminary pattern layer on a base substrate including a display area and a non-display area; forming a patterned resin layer on the preliminary pattern layer in the display area, the patterned resin layer including patterns formed on a surface of the patterned resin layer; surface-treating the preliminary pattern layer and the patterned resin layer; forming a mask pattern including a photoresist material on the preliminary pattern layer disposed in the non-display area; forming preliminary patterns on the preliminary pattern layer using the patterned resin layer; and forming a wire grid polarizing unit in the display area by etching the metal layer using the preliminary pattern and the mask pattern as a polarizing pattern.

According to one or more exemplary embodiments a method of fabricating a liquid crystal display device includes: disposing a first substrate including a first polarizing member, a signal wire, a thin film transistor, and a first electrode; disposing a second substrate including a second polarizing member and a second electrode, facing the first substrate; and disposing a liquid crystal layer between the first substrate and the second substrate, and bonding the liquid crystal layer, the first substrate, and the second substrate, wherein the first polarizing member and a second polarizing member are formed by: sequentially disposing a metal layer and a preliminary pattern layer on a base substrate including a display area and a non-display area; forming a patterned resin layer on the preliminary pattern layer in the display area, the patterned resin layer including patterns formed on a surface of the patterned resin layer; surface-treating the preliminary pattern layer and the patterned resin layer; forming a mask pattern including a photoresist material on the preliminary pattern layer disposed in the non-display area; forming preliminary patterns on the preliminary pattern layer using the patterned resin layer; and forming a wire grid polarizing unit by etching the metal layer using the preliminary pattern and the mask pattern as a polarizing pattern.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
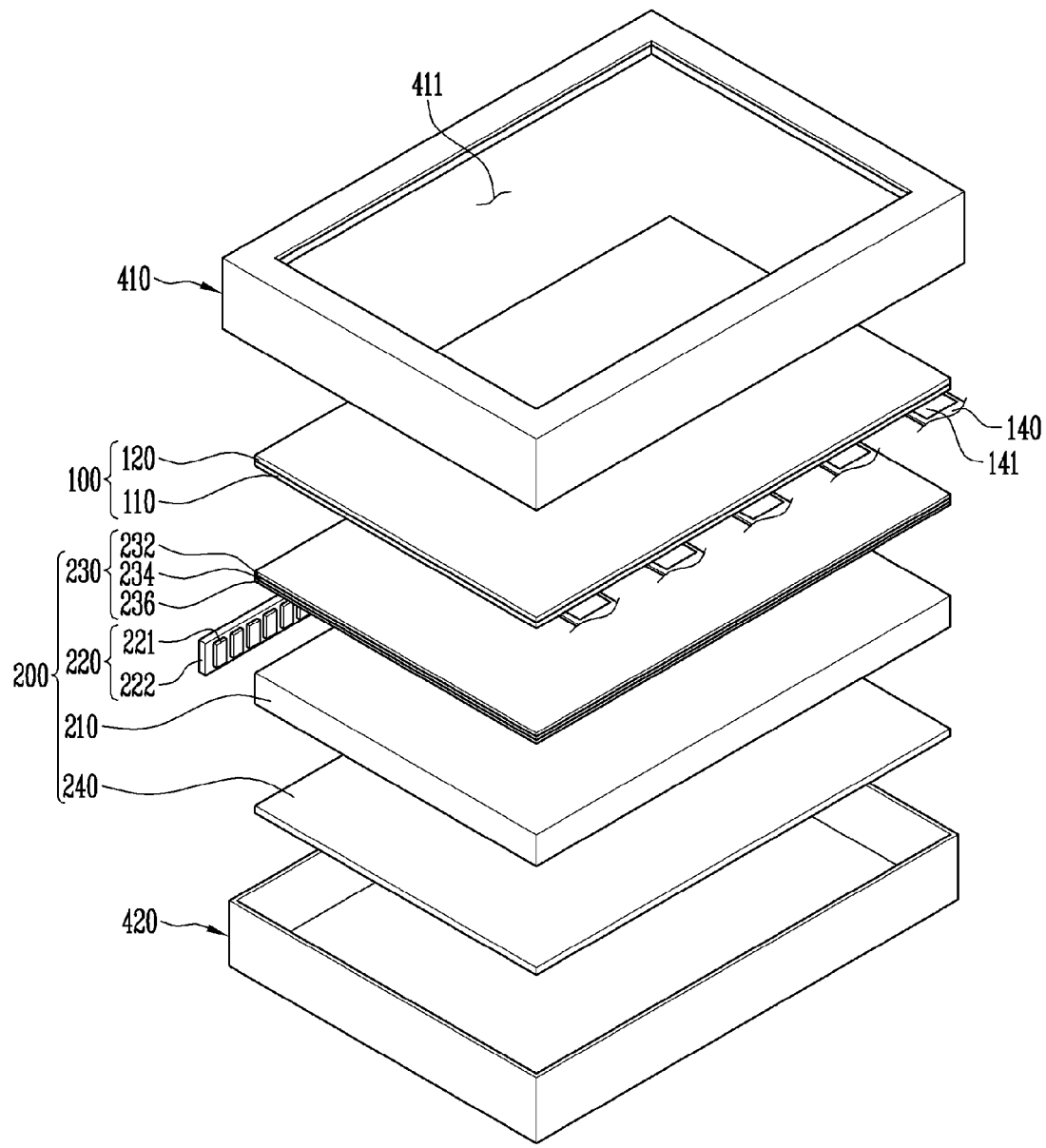
FIG. 1 is an exploded perspective diagram illustrating a liquid crystal display device according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

The term "About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, ±20%, ±10%, ±5% of the stated value.

Various exemplary embodiments are described herein with reference to plan and/or sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, one or more exemplary embodiments will be described in detail with reference to the accompanying drawings.

FIG. 1 is an exploded perspective diagram illustrating a liquid crystal display device according to one or more exemplary embodiments. Referring to FIG. 1, a liquid crystal display device may include a liquid crystal display panel 100, a backlight unit 200, an upper cover 410, and a lower cover 420.

The liquid crystal display panel 100 has a rectangular plate shape having a long side and a short side, and includes a display area DA (see FIGS. 7-16) configured to display an image, and a non-display area NDA (see FIGS. 7-16) disposed around the display area DA. The liquid crystal display panel 100 includes a first substrate 110, a second substrate 120 facing the first substrate 110, and a liquid crystal layer (not shown) formed between the first substrate 110 and the second substrate 120. Further, a polarizing film (not shown) may be attached to both surfaces of the liquid crystal display panel 100, that is, an external surface of each of the first substrate 110 and the second substrate 120 facing away from the each other.

A plurality of pixels (not shown) arranged in a matrix form may be disposed on the display area DA of the first substrate 110. Here, each of the plurality of pixels may include a plurality of sub pixels, and each of the plurality of sub pixels may have a color. For example, each of the plurality of sub pixels may have any one color of red, green, blue, cyan, magenta, and yellow. Accordingly, light emitted from each of the plurality of sub pixels may have any one color of red, green, blue, cyan, magenta, and yellow. Further, each of the plurality of pixels may include a gate line (not shown), a data line (not shown) disposed crossing, the data line insulated from the gate line, and a pixel electrode (not shown). Further, each pixel may include a thin film transistor (not shown) electrically connected to the gate line and the data line, and electrically connected to a corresponding pixel electrode. The thin film transistor may switch the corresponding pixel electrode according to a driving signal provided thereto.

An encapsulation pattern (not shown) bonding the first substrate 110 and the second substrate 120 may be disposed in the non-display area DNA of the first substrate 110.

The second substrate 120 may include a color filter (not shown) configured to implement a color using light provided by the backlight unit 200, and a common electrode (not shown) disposed on the color filter facing the pixel electrode (not shown). The color filter may have any one color among red, green, blue, cyan, magenta, and yellow. The color filter may be disposed by a process, such as deposition and/or coating. Here, the color filter may be disposed on the second substrate 120, but the exemplary embodiments are not limited thereto. For example, the color filter may also be disposed on the first substrate 110.

Molecules of the liquid crystal layer may be arranged in a specific direction by applying a voltage to the pixel electrode and the common electrode, and the liquid crystal display panel 100 may be configured to adjust transmittance of the light provided from the backlight unit 200 to display an image.

A signal input pad (not shown) may be disposed in the non-display area NDA on the external surface of one of the first substrate 110 and the second substrate 120. The signal input pad may be connected with a flexible circuit substrate 140, including an embedded driver IC 141, and the flexible circuit substrate 140 may be connected with an external circuit module (not shown). The driver IC 141 is configured to receive various control signals from the external circuit module, and output a driving signal to the thin film transistor and drive the liquid crystal display panel 100 in response to the input various control signals.

The backlight unit 200 is disposed opposite to a direction in which an image is displayed in the liquid crystal display panel 100. The backlight unit 200 may include a light guide plate 210, a light source unit 220 including a plurality of light sources 221, an optical member 230, and a reflection sheet 240.

The light guide plate 210 is disposed under the liquid crystal display panel 100. The light guide plate 210 may be configured to guide the light emitted from the light source unit 220 and transmit the light toward the liquid crystal display panel 100. Particularly, the light guide plate 210 overlaps at least the display area DA of the liquid crystal display panel 100. Here, the light guide plate 210 may include an emission surface, through which the light is emitted, a lower surface opposite to the emission surface, and lateral surfaces connecting the emission surface and the lower surface. At least one of the lateral surfaces may be an incident surface facing the light source unit 220, to which light emitted from the light source unit 220 may be incident, and a lateral surface facing the incident surface may be a light facing surface configured to reflect the incident light.

The light source unit 220 may include the plurality of light sources 221, for example, a plurality of light emitting diodes embedded in a printed circuit board 222.

Each of the plurality of light sources 221 may emit light having the same color. For example, the light sources 221 may emit light having white color. Each of the plurality of light sources 221 may emit light having different colors. For example, the plurality of light sources 221 may include light sources respectively configured to emit red light, green light, and blue light.

The light source unit 220 is disposed to emit light toward at least one of the lateral surfaces of the light guide plate 210, and configured to provide light used by the liquid crystal display panel 100 to displaying an image.

The optical member 230 is provided between the light guide plate 210 and the liquid crystal display panel 100. The optical member 230 is configured to control the light provided by the light source unit 220 and emitted through the light guide plate 210. The optical member 230 may include a diffusion sheet 236, a prism sheet 234, and a passivation sheet 232 sequentially stacked.

The diffusion sheet 236 is configured to diffuse light emitted from the light guide plate 210. The prism sheet 234 is configured to collect light diffused by the diffusion sheet 236 in a direction perpendicular to a plane of the liquid crystal display panel 100. Light passing through the prism sheet 234 is mostly perpendicularly incident to the liquid crystal display panel 100. The passivation sheet 232 is disposed on the prism sheet 234. The passivation sheet 232 is configured to protect the prism sheet 234 from external impact.

According to the exemplary embodiments, the optical member 230 includes one layer each of the diffusion sheet 236, the prism sheet 234, and the passivation sheet 232, but the exemplary embodiments are not limited thereto. The optical member 230 may include at least one of the diffusion sheet 236, the prism sheet 234, and the passivation sheet 232 including multiple layers, and may also omit any one of the diffusion sheet 236, the prism sheet 234, and the passivation sheet 232.

The reflection sheet 240 may be disposed under the light guide plate 210, and may be configured to reflect light that leaks, which is not emitted toward the liquid crystal display panel, and change the direction of the light toward the liquid crystal display panel 100. The reflection sheet 240 may include a light reflecting material. The reflection sheet 240 is provided on the lower cover 420, and configured to reflect light generated from the light source unit 220. As a result, the reflection sheet 240 may increase a quantity of light emitted toward the liquid crystal display panel 100.

The above-described exemplary embodiments configure the light source unit 220 to provide light toward the lateral surface of the light guide plate 210, but the exemplary embodiments are not limited thereto. For example, the light source unit 220 may be disposed to provide light toward the lower surface of the light guide plate 210. The light guide plate 210 may be omitted in the backlight unit 200, and the light source unit 220 may be disposed under the liquid crystal display panel 100, and the light emitted by the light source unit 220 may be directly provided to the liquid crystal display panel 100.

The upper cover 410 is disposed at an upper part of the liquid crystal display panel 100. The upper cover 410 may include a display window 411 exposing the display area DA of the liquid crystal display panel 100. The upper cover 410 may be coupled with the lower cover 420 to the edges of the liquid crystal display panel 100.

The lower cover 420 is disposed at a lower part of the backlight unit 200. The lower cover 420 may include a space capable of contain the liquid crystal display panel 100 and the backlight unit 200. The lower cover 420 may be coupled with the upper cover 410 to accommodate and support the liquid crystal display panel 100 and the backlight unit 200 within the lower cover 420.

Figure 2:
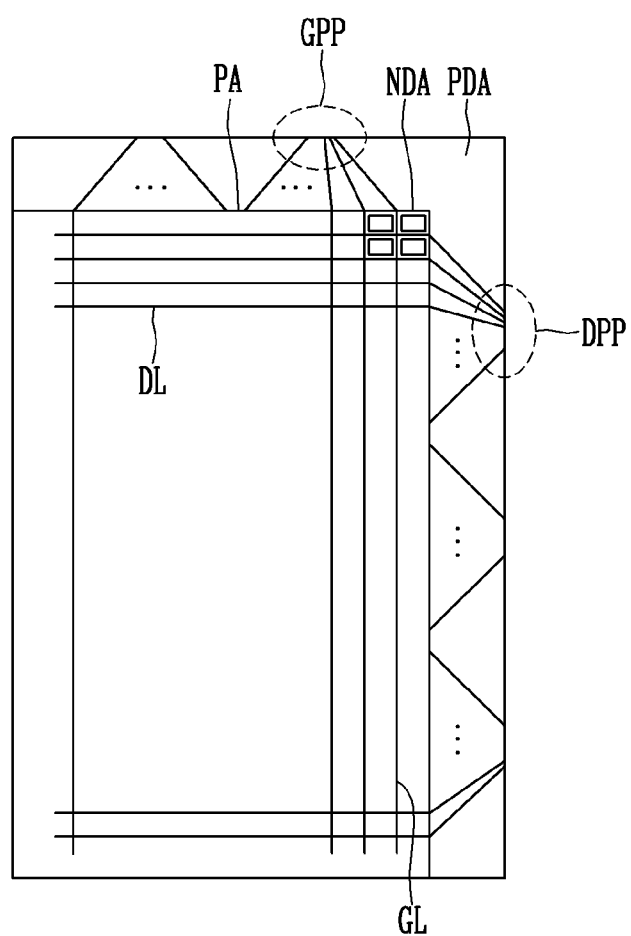
FIG. 2 is a top plane view illustrating a liquid crystal display panel illustrated in FIG. 1 according to one or more exemplary embodiments.
Figure 3:
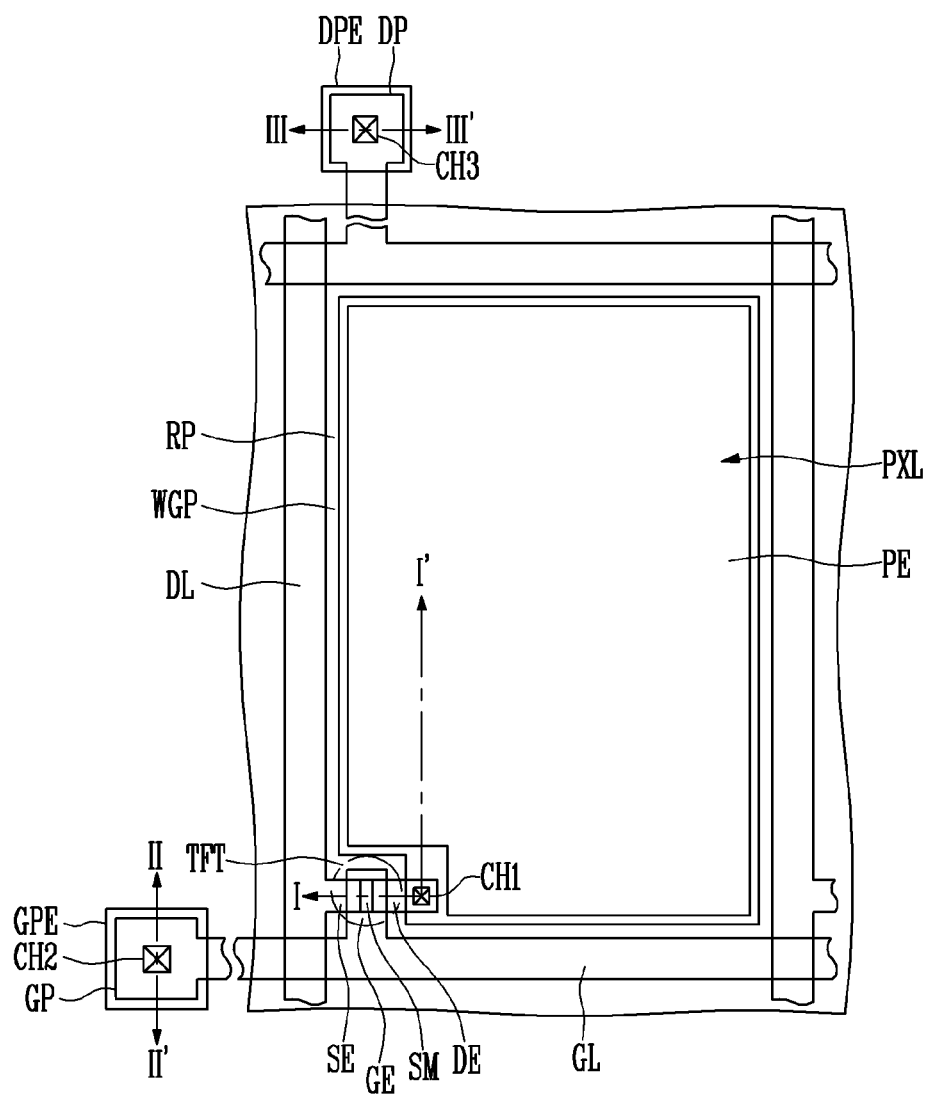
FIG. 3 is a top plane view illustrating one pixel of the liquid crystal display panel of FIG. 2 according to one or more exemplary embodiments.
Figure 4:
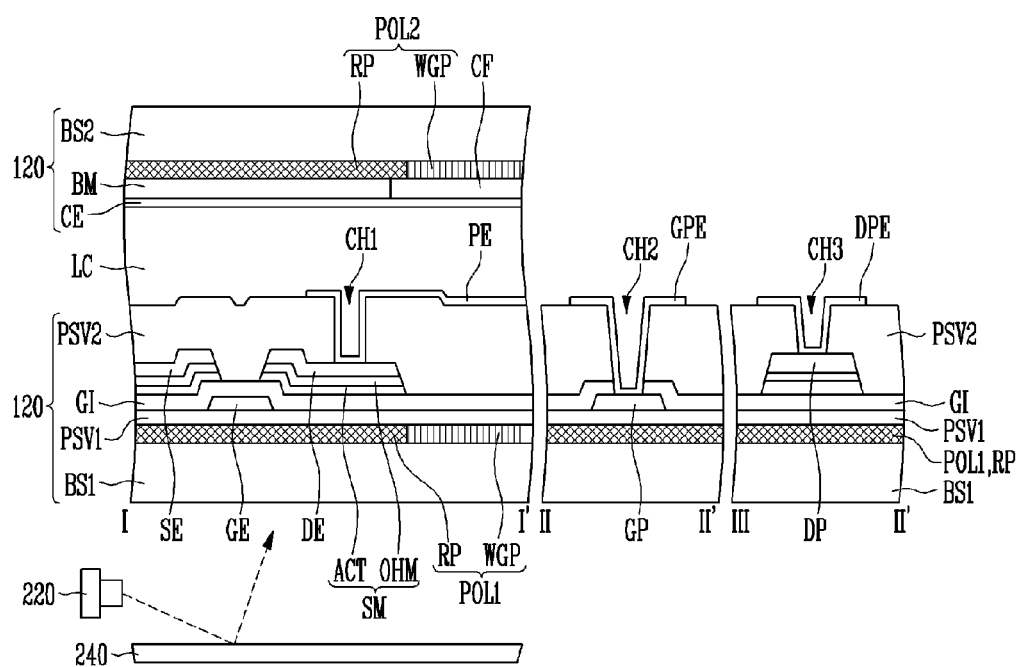
FIG. 4 is a cross-sectional view taken along sectional lines I-I', II-II', and III-III' of FIG. 3 according to one or more exemplary embodiments.

FIG. 2 is a top plane view illustrating the liquid crystal display panel illustrated in FIG. 1, FIG. 3 is a top plane view illustrating one pixel of the liquid crystal display panel of FIG. 2, and FIG. 4 is a cross-sectional view taken along sectional lines I-I', II-II', and III-III' of FIG. 3.

Referring to FIGS. 2, 3, and 4, the liquid crystal display panel may include a plurality of pixels PXL, and the pixels PXL may be arranged in a matrix form having a plurality of columns and a plurality of rows. Each of the pixels PXL may have the same structure. Referring to FIG. 3, each of the plurality of pixels PXL may have a rectangular shape elongated in one direction, but exemplary embodiments are not limited thereto. The shape of each of the plurality of pixels PXL may have various shapes, such as a "V"-shape and a "Z"-shape.

The liquid crystal display panel 100 may include a first substrate 110, a second substrate 120 facing the first substrate 110, and a liquid crystal layer LC disposed between the first substrate 110 and the second substrate 120.

The first substrate 110 may include a first base substrate BS1, a first polarizing member POL1 disposed on the first base substrate BS1, a wiring unit disposed on the first polarizing member POL1, a thin film transistor connected to the wiring unit, and a first electrode PE connected to the thin film transistor.

The first base substrate BS1 may be either a rigid substrate or a flexible substrate. The rigid substrate may include at least one of a glass base substrate, a quartz base substrate, a glass ceramic base substrate, and a crystalline glass base substrate. The flexible substrate may include a film base substrate and a plastic base substrate including a polymer organic material. A material included in the first base substrate BS1 may be resistant against a high process temperature (i.e., heat resistant) during a fabricating process.

The first base substrate BS1 may include a pixel area PA in including the plurality of pixels PXL, and a pad area PDA disposed at one side of the pixel area PA. The pixel area PA may include the display area DA in which the plurality of pixels PXL are disposed. The non-display area NDA may include the pad area PDA and a part of the pixel area PA outside the display area DA in which an image is not displayed.

The first polarizing member POL1 may be disposed within the display area DA on the first base substrate BS1. The first polarizing member POL1 includes a wire grid polarizing unit WGP through which light passes, and a reflection part RP for reflecting light.

The wire grid polarizing unit WGP may be a wire grid polarizer configured to linearly polarize light. That is, the wire grid polarizer may include fine metal wires regularly disposed parallel to each other in one direction.

The fine metal wire may have a width of about 10 nm to about 60 nm, and a thickness of about 150 nm to about 200 nm. Further, a distance between the adjacent fine metal wires may be about 100 nm. The fine metal wires may be disposed in a direction parallel, vertical, or inclined with respect to one side of the pixel area PA.

The light vibrates horizontally and vertically with respect to the moving direction. The light incident onto the wire grid polarizer that vibrates parallel to the fine metal wires may pass through the wire grid polarizer, and the residual light may be reflected at the fine metal wires. For example, P-polarized light may pass through the wire grid polarizer, and S-polarized light may not pass through the wire grid polarizer and be reflected. That is, only the P-polarized light may pass through the wire grid polarizer. The P-polarized light refers to polarized light with its electric field parallel with a plane of incidence and the S-polarized light refers to polarized light with its electric field perpendicular to the plane of incidence.

The fine metal wires may include a metal having high reflectance. For example, the fine metal wires may include at least one of aluminum, gold, silver, copper, chrome, iron, nickel, molybdenum, and an alloy thereof. Particularly, the fine metal wire may include aluminum having relatively high reflectance.

The fine metal wires may include a single layer structure including at least one of the above metals. The fine metal wires may include a multilayer structure including at least one or more layers, each including at least one of the above metals stacked. For example, the fine metal wires may have a dual layer structure including a lower layer including aluminum and an upper layer including titanium, and the fine metal wires may also have a dual layer structure including a lower layer including aluminum and an upper layer including molybdenum.

The reflection part RP may be disposed in the non-display area NDA of the first base substrate BS1. The reflection part RP may include the same material as that of the fine metal wires, and be configured to reflect incident light.

A first passivation layer PSV1 may be disposed on the first polarizing member POL1 and the reflection part RP. That is, the first passivation layer PSV1 may cover the first polarizing member POL1 and the reflection part RP. The first passivation layer PSV1 may include at least one of a silicon oxide (SiOx) and a silicon nitride (SiNx).

The wiring unit may be disposed in the non-display area NDA on the first passivation layer PSV1. The wiring unit may include a gate line GL, a data line DL, a gate pad unit GPP, and a data pad unit DPP disposed in the non-display area NDA. The gate pad unit GPP and the data pad unit DPP will be described below.

The gate line GL may be disposed on the first passivation layer PSV1. The gate line GL may be extended in a first direction, for example, parallel to one side of the pixel area PA. A gate insulating layer GI may be disposed on the gate line GL. The gate insulating layer GI may include at least one of a silicon oxide ($SiN_x$) and a silicon nitride ($SiO_x$).

The data line DL may be disposed on the gate insulating layer GI. The data line DL may be extended in a second direction crossing the gate line GL. That is, the data line DL may be insulated from the gate line GL by the gate insulating layer GI.

The thin film transistor may be disposed in the non-display area NDA. The thin film transistor may be connected to the gate line GL and the data line DL. The thin film transistor may include a gate electrode GE, a semiconductor layer SM, a source electrode SE, and a drain electrode DE.

The gate electrode GE may have a shape protruding from the gate line GL, formed as a partial area of the gate line GL. The gate line GL and the gate line GE may include at least one of nickel, chrome, molybdenum, aluminum, titanium, copper, tungsten, and an alloy thereof. The gate line GL and the gate electrode GE may have a single layer or a multilayer structure including the above metal material. For example, the gate line GL and the gate electrode GE may have a triple layer structure including at least one of molybdenum, aluminum, and molybdenum sequentially stacked. The gate line GL and the gate electrode GE may have a dual layer structure including at least one of titanium and copper sequentially stacked. The gate line GL and the gate electrode GE may have a single layer structure including at least one of titanium and copper. The gate electrode GE may be covered by the gate insulating layer GI.

The semiconductor layer SM may be disposed on the gate insulating layer GI, and at least a part of the semiconductor layer SM may overlap the gate electrode GE. The semiconductor layer SM may include a semiconductor active layer ACT disposed on the gate insulating layer GI, and an ohmic contact layer OHM disposed on the semiconductor active layer ACT.

The semiconductor active layer ACT may include any one of amorphous silicon a-Si, polycrystalline silicon p-Si, and an oxide semiconductor. Here, the oxide semiconductor may include at least one of Zn, In, Ga, Sn, and a mixture thereof. For example, the oxide semiconductor layer may include an indium-gallium-zinc oxide (IGZO).

The ohmic contact layer OHM may improve an electric contact property between the semiconductor active layer ACT and the source electrode SE or between the semiconductor active layer ACT and the drain electrode DE. The ohmic contact layer OHM may include a conductive oxide.

The source electrode SE may be connected to one side of the semiconductor layer SM, and may have a shape branched from the data line DL. The drain electrode DE may be connected to the other side of the semiconductor layer SM, and be disposed spaced apart from the source electrode SE on the semiconductor layer SM. An area between the source electrode SE and the drain electrode DE in the semiconductor layer SM may form a conductive channel.

The data line DL, the source electrode SE, and the drain electrode DE may respectively include at least one of nickel, chrome, molybdenum, aluminum, titanium, copper, tungsten, and an alloy thereof. For example, the data line DL, the source electrode SE, and the drain electrode DE may have a triple layer structure including sequentially stacked molybdenum, aluminum, and molybdenum. The data line DL, the source electrode, and the drain electrode DE may have a dual layer structure including sequentially stacked titanium and copper.

A second passivation layer PSV2 may be disposed on the data line DL, the source electrode SE, and the drain electrode DE. The second passivation layer PSV2 may include one or more layers. For example, the second passivation layer PSV2 may include an inorganic passivation layer and an organic passivation layer disposed on the inorganic passivation layer. The inorganic passivation layer may include at least one of a silicon oxide and a silicon nitride. The organic passivation layer may include any one of acryl, polyimide (PI), polyamide (PA), and benzocycloubutene (BCB). That is, the organic passivation layer may be a flattening layer, which is transparent and flexible configured to smooth and flatten an uneven surface of a lower structure.

The first electrode PE may be disposed on the second passivation layer PSV2. The first electrode PE may be connected to the drain electrode DE through a first contact hole CH1 disposed on the second passivation layer PSV2. The first electrode PE may include a transparent conductive oxide. The transparent conductive oxide may include at least one of an indium tin oxide (ITO), an indium zinc oxide (IZO), an aluminum zinc oxide (AZO), a gallium doped zinc oxide (GZO), a zinc tin oxide (ZTO), a gallium tin oxide (GTO), and a fluorine doped tin oxide (FTO).

The gate pad part GPP and the data pad part DPP in the wiring unit may be disposed in the pad area PDA.

The gate pad part GPP includes a gate pad GP, and a gate pad electrode GPE connected to the gate electrode GP. The gate pad GP may be disposed on the first passivation layer PSV1. The gate insulating layer GI and the second passivation layer PSV2 cover the gate pad GP, and include a second contact hole CH2 exposing the gate pad GP. The gate pad electrode GPE is connected with the gate pad GP through the second contact hole CH2. Accordingly, the gate pad electrode GPE may electrically connect the gate pad GP and the gate line GL.

The data pad part DPP includes a data pad DP, and a data pad electrode DPE connected to the data electrode DP. The data line DP may be disposed on the gate insulating layer GI. The second passivation layer PSV2 covers the data pad DP, and includes a third contact hole CH3 exposing the data pad DP. The data pad electrode DPE is connected with the data pad DP through the third contact hole. Accordingly, the data pad electrode DPE may electrically connect the gate pad DP and the data line DL.

According to the present exemplary embodiment, the gate pad part GPP and the data pad part DPP may be electrically connected with an external wire. However, the exemplary embodiments are not limited thereto. For example, a gate driver including a plurality of amorphous silicon transistors may be included instead of the gate pad part GPP. The amorphous silicon transistors may be directly disposed on the pad area PDA of the first base substrate BS1 using a thin film transistor fabricating process.

The second substrate 120 may include a second base substrate BS2, a second polarizing member POL2, a color filter CF, a black matrix BM, and a second electrode CE.

The second base substrate BS2 may be disposed facing the first base substrate BS1, and may include the same material as that of the first base substrate BS1.

The second polarizing member POL2 may be disposed on one surface of the second base substrate BS2, for example, a surface facing the first base substrate BS1. The second polarizing member POL2 is configured to polarize light moving toward the second substrate 120 emitted from the first substrate 110. That is, the second polarizing member POL2 is configured to polarize light passing through the liquid crystal layer LC.

The second polarizing member POL2 may include the same structure of the first polarizing member POL1. A polarization axis of the second polarizing member POL2 may be vertical or parallel to the polarizing axis of the first polarizing member POL1. A direction of the polarization axis of the second polarizing member POL2 may be determined corresponding to the type of liquid crystal molecular of the liquid crystal layer LC. According to one or more exemplary embodiment, the second polarizing member POL2 may have the polarizing axis vertical to the polarizing axis of the first polarizing member POL1.

An additional passivation layer (not shown) may be disposed on the second polarizing member POL2. The passivation layer may include the same material as that of the first passivation layer PSV1.

The color filter CF may be disposed on the second polarizing member POL2. The color filter CF is configured to assign a color to the light passing through the plurality of pixels PXL. The color filter CF may include one of a red color filter, a green color filter, a blue color filter. The color filter CF may include one of a cyan color filter, a magenta color filter, a yellow color filter. The present exemplary embodiment illustrates that the second substrate 120 includes the color filter CF, but the exemplary embodiments are not limited thereto. For example, the first substrate 110 may also include the color filter CF.

The black matrix BM may be disposed in the non-display area NDA. The black matrix BM is configured to block the light which leaks when the liquid crystal display device implements an image. The black matrix BM may be disposed at one side of the color filter. For example, the black matrix BM may be disposed at a circumference of the color filter CF disposed at a circumference of the plurality of pixels PXL. The color filter CF and the black matrix BM may overlap in an area adjacent to a boundary of the pixels PXLs.

The second electrode CE may be disposed on the color filter CF and the black matrix BM. The second electrode CE is configured to form an electric field with the first electrode PE. The second electrode CE may include the same material as that of the first electrode PE.

The liquid crystal layer LC may be disposed between the first substrate 110 and the second substrate 120. The liquid crystal layer LC may include liquid crystal molecules having optical anisotropy. The liquid crystal molecules may be aligned by applying an electric field between the first electrode PE and the second electrode CE to control the amount of light passing through.

Figure 5:
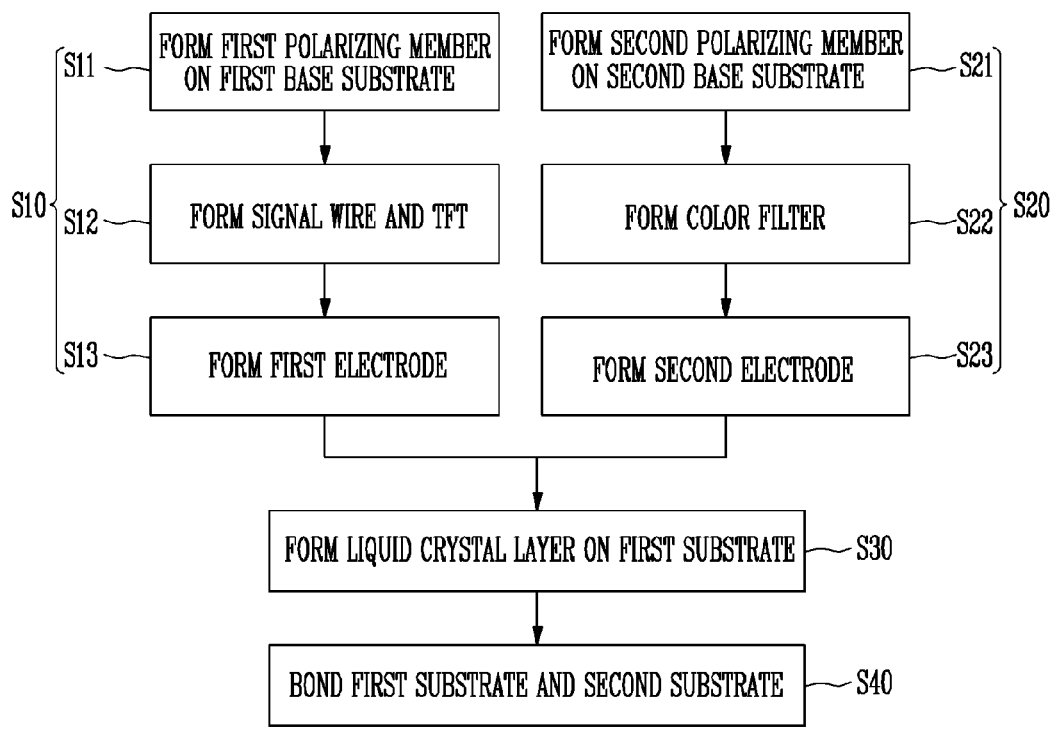
FIG. 5 is a flowchart describing a method of fabricating the liquid crystal display panel illustrated in FIGS. 1, 2, 3, and 4 according to one or more exemplary embodiments.

FIG. 5 is a flowchart describing a method of fabricating the liquid crystal display panel illustrated in FIGS. 1, 2, 3, and 4 according to one or more exemplary embodiments.

Referring to FIG. 5, a method of fabricating the liquid crystal display panel may include fabricating a first substrate (S10), fabricating a second substrate (S20), forming a liquid crystal layer on the first substrate (S30), and bonding the first substrate and the second substrate (S40).

Fabricating the first substrate may include forming a first polarizing member on a first base substrate (S11), forming a wiring unit and a thin film transistor (S12), and forming a first electrode (S13).

Fabricating the second substrate (S20) may include forming a second polarizing member on a second base substrate BS2 (S21), forming a color filter (S22), and forming a second electrode (S23).

Figure 6:
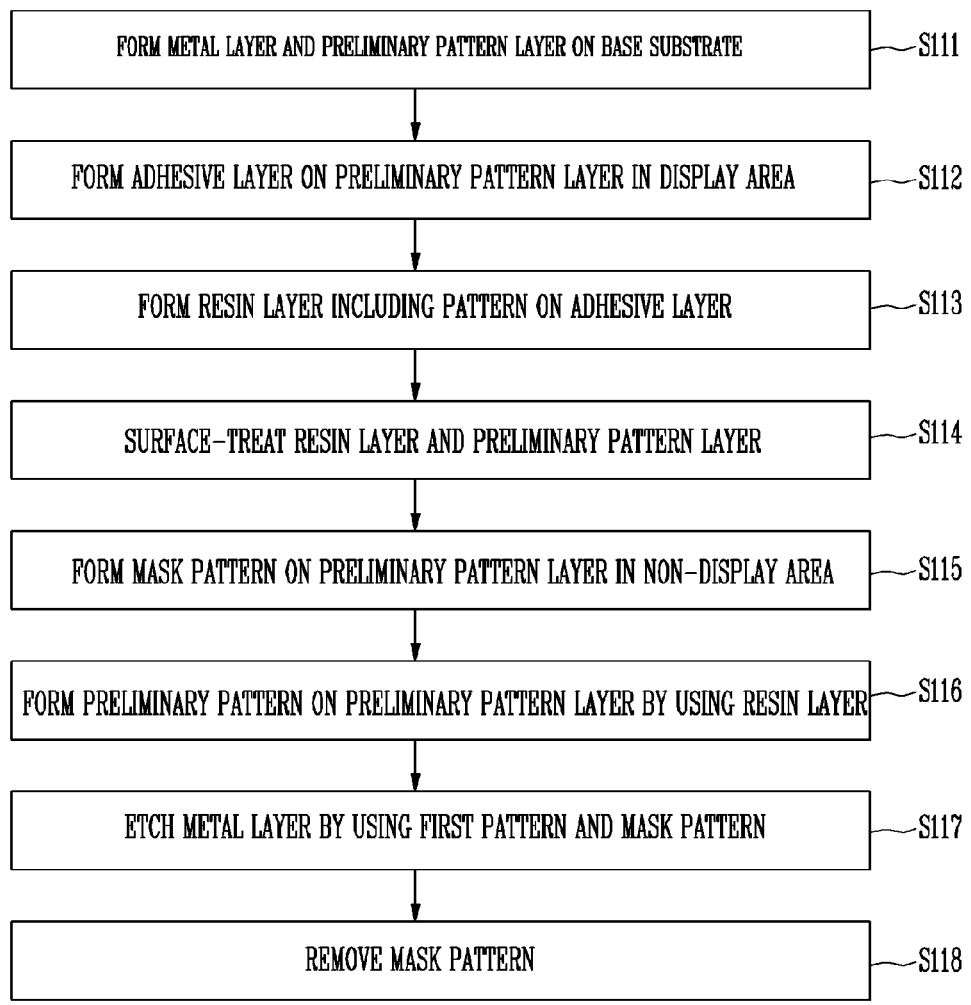
FIG. 6 is a flowchart describing a method of fabricating a polarizing member illustrated in FIGS. 1, 2, 3, 4, and 5 according to one or more exemplary embodiments.

FIG. 6 is a flowchart describing a method of fabricating the polarizing member illustrated in FIGS. 1, 2, 3, 4, and 5 according to one or more exemplary embodiments, and FIGS. 7, 8, 9, 10, 11, 12, 13, 14, 15, and 16 are cross-sectional views for describing each operation of FIG. 6, according to one or more exemplary embodiments.

Referring to FIG. 6, a method of fabricating a polarizing member may include forming a metal layer and a preliminary pattern layer on a base substrate including a display area and a non-display area (S111), forming an adhesive layer on the preliminary pattern layer in the display area (S112), forming a resin layer including a pattern on the adhesive layer (S113), surface treating the resin layer and the preliminary pattern layer (S114), forming a mask pattern on the preliminary pattern in the non-display area (S115), forming a preliminary pattern on the preliminary pattern layer by using the resin layer (S116), etching a metal layer by using the preliminary pattern and the mask pattern (S117), and removing the mask pattern (S118).

Figure 7:
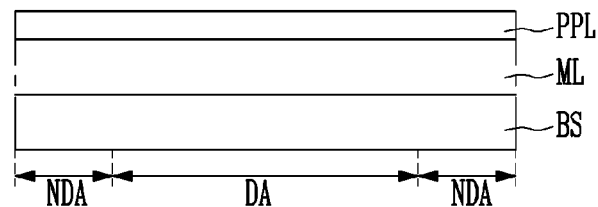
FIGS. 7, 8, 9, 10, 11, 12, 13, 14, 15, and 16 are cross-sectional views illustrating the method of fabricating a polarizing member illustrated in FIG. 6, according to one or more exemplary embodiments.

In accordance with forming the metal layer and the preliminary pattern layer on the base substrate including the display area and the non-display area (S111), the metal layer ML and the preliminary pattern layer PPL may be sequentially formed on the base substrate BS as illustrated in FIG. 7.

The metal layer ML may include a metal having a high reflectance. For example, the metal layer ML may include at least one of aluminum, gold, silver, copper, chrome, iron, nickel, molybdenum, and an alloy thereof. For example, the metal layer ML may include aluminum.

The metal layer ML may include a single layer structure including at least one of the above metals. The metal layer ML may also include a multilayer structure including at least one or more layers each including at least one of the above metals stacked. For example, the metal layer ML may have a dual layer structure including a lower layer including aluminum and an upper layer including titanium, and the metal layer ML may also have a dual layer structure including a lower layer including aluminum and an upper layer including molybdenum.

The preliminary pattern layer PPL may be disposed on the metal layer ML, and include an inorganic insulating material. For example, the preliminary pattern layer PPL may include at least one of a silicon nitride ($SiN_x$) and a silicon oxide ($SiO_x$).

Figure 8:
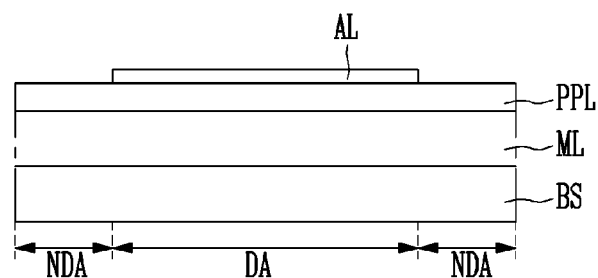

In accordance with forming the adhesive layer on the preliminary pattern layer in the display area (S112), the adhesive layer AL is disposed on the display area of the preliminary pattern layer PPL as illustrated in FIG. 8. The adhesive layer AL may improve coupling force between the resin layer RL (referring to FIG. 9) and the preliminary pattern layer PPL. The adhesive layer AL may be formed by disposing an adhesive material on the display area DA using an injection nozzle, for example, an inkjet nozzle.

Figure 9:
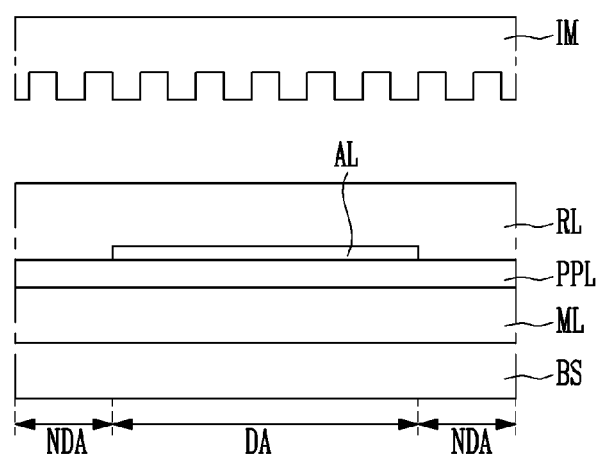
Figure 10:
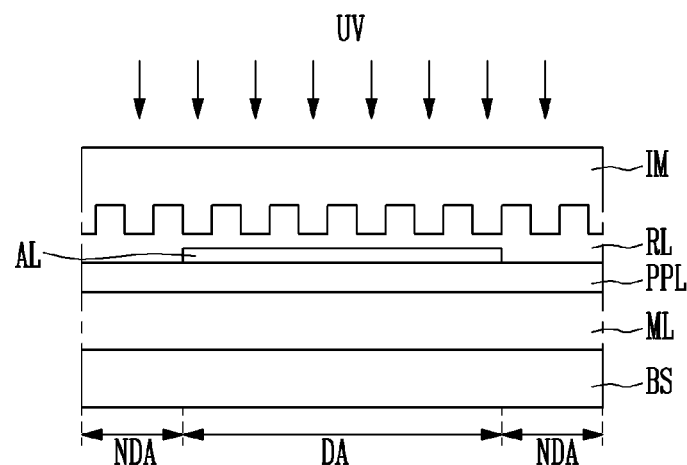
Figure 11:
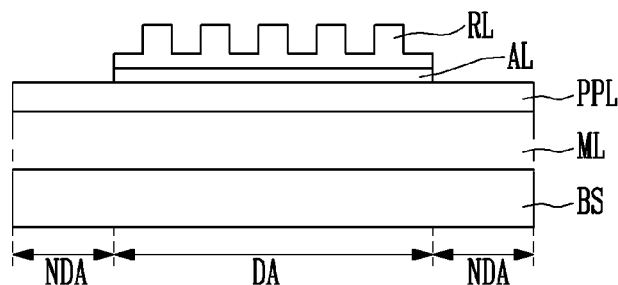

In accordance with forming the resin layer including the pattern on the adhesive layer (S113), the resin layer RL is formed on the preliminary pattern layer PPL and the adhesive layer AL, and forming the resin layer RL by using an imprint mold IM, as illustrated in FIGS. 9, 10, and 11.

More particularly, referring to FIG. 9, the resin layer RL is formed on the preliminary pattern layer PPL and the adhesive layer AL. The resin layer RL may include an organic material which may be hardened by heat or ultraviolet rays. For example, the resin layer RL may include an organic material including one of fluorinated oligomer and fluorinated monomer. The resin layer RL may have strong coupling force with the adhesive layer AL, and weak coupling force with the preliminary pattern layer PPL.

The resin layer RL may be patterned by using the imprint mold IM. The imprint mold IM may have a pattern inversely corresponding to the patterned resin layer RL. The imprint mold IM is disposed on the resin layer RL, and a pressure is applied to the imprint mold IM to pattern the resin layer RL.

Referring to FIG. 10, the resin layer RL is hardened by applying heat or ultraviolet rays after the resin layer RL is patterned. In the present exemplary embodiment, the resin layer RL may be hardened by applying ultraviolet rays.

The coupling force between the resin layer RL and the imprint mold IM may be smaller than coupling force between the resin layer RL and the adhesive layer AL. The coupling force between the resin layer RL and the imprint mold IM may be greater than coupling force between the resin layer RL and the preliminary pattern layer PPL.

Figure 12:
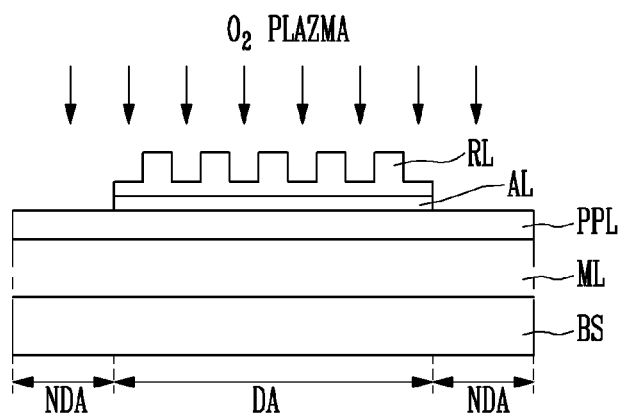

Referring to FIG. 12, the imprint mold IM is removed. The coupling force between the resin layer RL and the imprint mold IM is smaller than coupling force between the resin layer RL and the adhesive layer AL, and is greater than coupling force between the resin layer RL and the preliminary pattern layer PPL. Accordingly, the resin layer RL disposed in the non-display area NDA may be removed together with the imprint mold IM. Accordingly, a part of the preliminary pattern layer PPL corresponding to the non-display area NDA may be exposed.

Referring further to FIG. 12, the surface treating the resin layer and the preliminary pattern layer (S114) may include performing a surface treatment process, and a surface of the resin layer RL may be hydrophobic, and a surface of the preliminary pattern layer PPL may be hydrophilic. Here, the surface treating process may include an oxygen plasma process and/or an ozone process. In the present exemplary embodiment, the surface treatment process may be an oxygen plasma process. The surface treatment processes of the resin layer RL and the preliminary pattern layer PPL may be performed simultaneously.

A surface of the resin layer RL may have a low effective surface energy by including fluorine in the resin layer using the surface treatment process. Accordingly, the surface of the resin layer RL may be hydrophobic.

OH groups may be formed on a surface of an exposed area of the preliminary pattern layer PPL by the surface treatment process. Accordingly, a surface of the preliminary pattern layer PPL may be hydrophobic.

Figure 13:
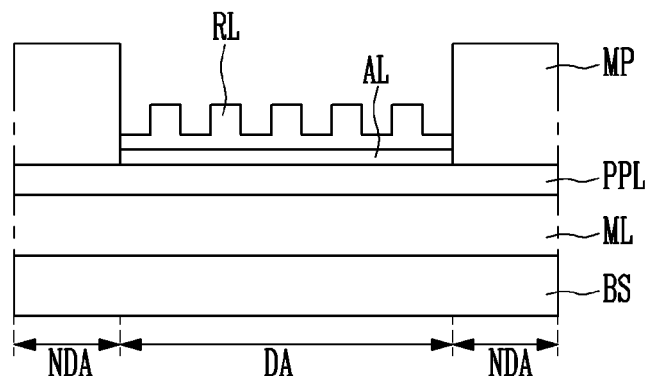

Referring to FIG. 13, forming a mask pattern on the preliminary pattern layer in the non-display area (S115) may include forming a mask pattern MP including a photoresist material on the preliminary pattern layer PPL. The mask pattern MP may be formed by applying the photoresist material onto the resin layer RL and the preliminary pattern layer PPL. According to different surface properties of the resin layer RL and the preliminary pattern layer PPL, the photoresist material may be disposed only on the preliminary pattern layer PPL. Accordingly, the mask pattern MP may be formed without a separate exposure process.

Figure 14:
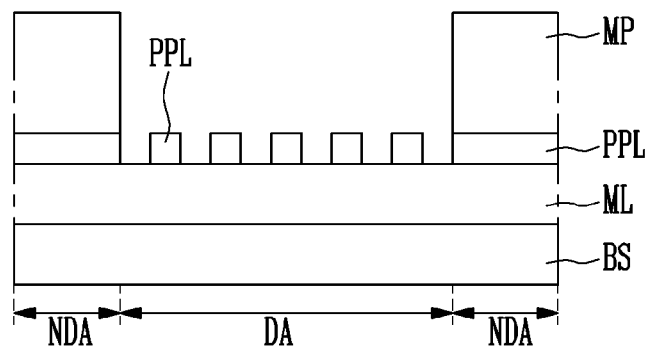

Referring to FIG. 14, forming the preliminary pattern on the preliminary pattern layer by using the resin layer (S116) may include forming the preliminary pattern layer PPL by using the resin layer RL and the mask pattern MP as masks. The resin layer RL may be removed by the patterning to form a preliminary pattern layer PPL having the same pattern as the resin layer RL.

Figure 15:
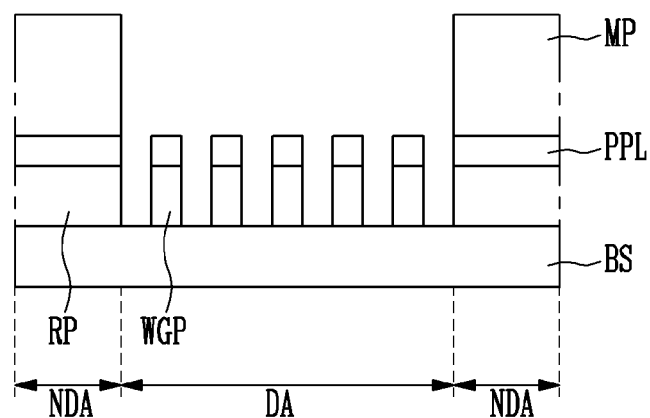

Referring to FIG. 15, etching the metal layer using the preliminary pattern and the mask pattern (S117) may include forming a wire grid polarizing unit WGP by etching the metal layer ML using the mask pattern MP and the preliminary pattern layer PPL as the masks. The wire grid polarizing unit WGP may be a wire grid polarizer including fine metal wires. The area in which the mask pattern MP is disposed is not etched, so a reflection part RP configured to reflect light incident onto the polarizing member may be formed.

Figure 16:
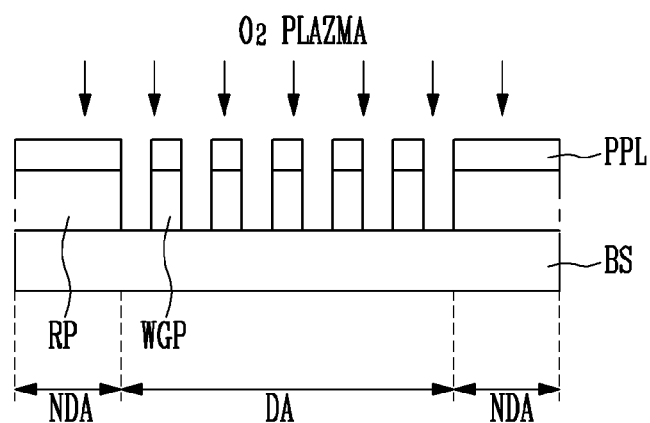

Referring to FIG. 16, in removing the mask pattern (S118), the mask pattern MP disposed in the non-display area may be removed.

According to one or more exemplary embodiments, the method of fabricating the polarizing member may fabricate the polarizing member including the wire grid polarizing unit WGP without a photolithography process. Therefore, the manufacturing cost may be decreased compared to the photolithography process. Accordingly, the liquid crystal display device including the polarizing member may be fabricated with reduced costs.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of fabricating a polarizing member, comprising:
    sequentially disposing a metal layer and a preliminary pattern layer on a base substrate comprising a display area and a non-display area;
    forming a patterned resin layer on the preliminary pattern layer in the display area, the patterned resin layer comprising patterns formed on a surface of the patterned resin layer;
    surface-treating the preliminary pattern layer and the patterned resin layer;
    forming a mask pattern comprising a photoresist material on the preliminary pattern layer disposed in the non-display area;
    forming preliminary patterns on the preliminary pattern layer using the patterned resin layer; and
    forming a wire grid polarizing unit in the display area by etching the metal layer using the preliminary pattern and the mask pattern as a polarizing pattern.

2. The method of claim 1, wherein sequentially disposing a metal layer and a preliminary pattern layer further comprises:
    forming an adhesive layer on the preliminary pattern layer in the display area.

3. The method of claim 2, wherein the surface-treating comprises one of an oxygen plasma treatment process and an ozone treatment process.

4. The method of claim 3, wherein the surface-treating is configured to treat a surface of the patterned resin layer to be hydrophobic, and a surface of the preliminary pattern layer to be hydrophilic.

5. The method of claim 4, wherein the mask pattern is disposed on the preliminary pattern layer according to surface properties of the patterned resin layer and the preliminary pattern layer.

6. The method of claim 5, wherein the mask pattern comprises a photoresist material.

7. The method of claim 6, wherein the forming the patterned resin layer comprises:
    forming a resin layer on the adhesive layer and the preliminary pattern layer;
    patterning the resin layer using an imprint mold comprising patterns inversely corresponding to the patterns on the resin layer;
    hardening the resin layer; and
    removing the imprint mold to form the patterned resin layer comprising the pattern on the adhesive layer.

8. The method of claim 7, wherein the resin layer comprises one of fluorinated oligomer and fluorinated monomer.

9. The method of claim 8, wherein hardening the resin layer comprises radiating the resin layer with ultraviolet rays or applying heat to the resin layer.

10. The method of claim 9, wherein a first coupling force between the resin layer and the imprint mold is smaller than a second coupling force between the resin layer and the adhesive layer.

11. The method of claim 10, wherein the first coupling force between the resin layer and the imprint mold is greater than a third coupling force between the resin layer and the preliminary pattern layer.

12. The method of claim 11, wherein forming of the wire grid polarizing unit comprises dry etching the metal layer in the display area using the preliminary patterns and the mask pattern to form the wire grid polarizing unit comprising fine metal wires.

13. The method of claim 12, further comprising:
removing the mask pattern.

14. The method of claim 1, further comprising configuring the metal layer disposed in the non-display area as a reflection part.

15. A method of fabricating a liquid crystal display device, comprising:
disposing a first substrate comprising a first polarizing member, a signal wire, a thin film transistor, and a first electrode;
disposing a second substrate comprising a second polarizing member and a second electrode, facing the first substrate; and
disposing a liquid crystal layer between the first substrate and the second substrate, and bonding the liquid crystal layer, the first substrate, and the second substrate,
wherein the first polarizing member and a second polarizing member are formed by:
sequentially disposing a metal layer and a preliminary pattern layer on a base substrate comprising a display area and a non-display area;
forming a patterned resin layer on the preliminary pattern layer in the display area, the patterned resin layer comprising patterns formed on a surface of the patterned resin layer;
surface-treating the preliminary pattern layer and the patterned resin layer;
forming a mask pattern comprising a photoresist material on the preliminary pattern layer disposed in the non-display area;
forming preliminary patterns on the preliminary pattern layer using the patterned resin layer; and
forming a wire grid polarizing unit by etching the metal layer using the preliminary pattern and the mask pattern as a polarizing pattern.

16. The method of claim 15, wherein sequentially disposing a metal layer and a preliminary pattern layer further comprises:
forming an adhesive layer on the preliminary pattern layer in the display area.

17. The method of claim 16, wherein the surface-treating is configured to treat a surface of the patterned resin layer to be hydrophobic, and a surface of the preliminary pattern layer to be hydrophilic.

18. The method of claim 17, wherein the forming the patterned resin layer comprises:
forming a resin layer on the adhesive layer and the preliminary pattern layer;
forming patterns on the resin layer using an imprint mold comprising patterns inversely corresponding to the pattern on the resin layer;
hardening the resin layer; and
removing the imprint mold to form the patterned resin layer comprising the pattern on the adhesive layer.

19. The method of claim 18, wherein coupling force between the resin layer and the imprint mold is smaller than coupling force between the resin layer and the adhesive layer, and
coupling force between the resin layer and the imprint mold is greater than coupling force between the resin layer and the preliminary pattern layer.

20. The method of claim 19, wherein the forming of the wire grid polarizing unit comprises dry etching the metal layer in the display area using the preliminary pattern and the mask pattern to form the wire grid polarizing unit comprising fine metal wires.

* * * * *